United States Patent [19]

Kroeger et al.

[11] Patent Number: 4,847,874
[45] Date of Patent: Jul. 11, 1989

[54] CLOCK RECOVERY SYSTEM FOR DIGITAL DATA

[75] Inventors: Brian W. Kroeger, Ellicott City; John J. Kurtz, Catonsville, both of Md.

[73] Assignee: Westinghouse Electric Corp., Pittsburgh, Pa.

[21] Appl. No.: 94,629

[22] Filed: Sep. 9, 1987

[51] Int. Cl.[4] .............................................. H03D 3/24
[52] U.S. Cl. ..................................... 375/110; 331/1 A
[58] Field of Search ......................... 375/108, 97, 110; 331/1 A

[56] References Cited

U.S. PATENT DOCUMENTS 4,651,103  3/1987  Grimes ............................. 375/108 X
4,704,722  11/1987 Henry .............................. 331/1 A X
4,750,193  6/1988  Bailey .............................. 331/1 A X Primary Examiner—Derek S. Jennings
Attorney, Agent, or Firm—W. G. Sutcliff

[57] ABSTRACT

A system and method for recovering a clock signal from digital data signals which do not include a separate clock signal. The system and method detect transitions from one logic state to the other logic state in the digital data signal, and compare the time alignment of these logic state transitions to an input clock signal from a voltage controlled oscillator. A correction control signal is generated as a function of the time alignment of the digital data signal transition with the input clock signal, and applied to the oscillator to vary the frequency of the clock signal as a function of the correction control signal, whereby a digital data recovered clock signal is aligned with the digital data signal.

8 Claims, 4 Drawing Sheets

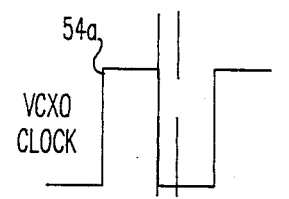
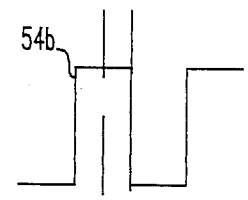
CLOCK LEADS DATA                CLOCK LAGS DATA
FIG. 4A                         FIG. 4B
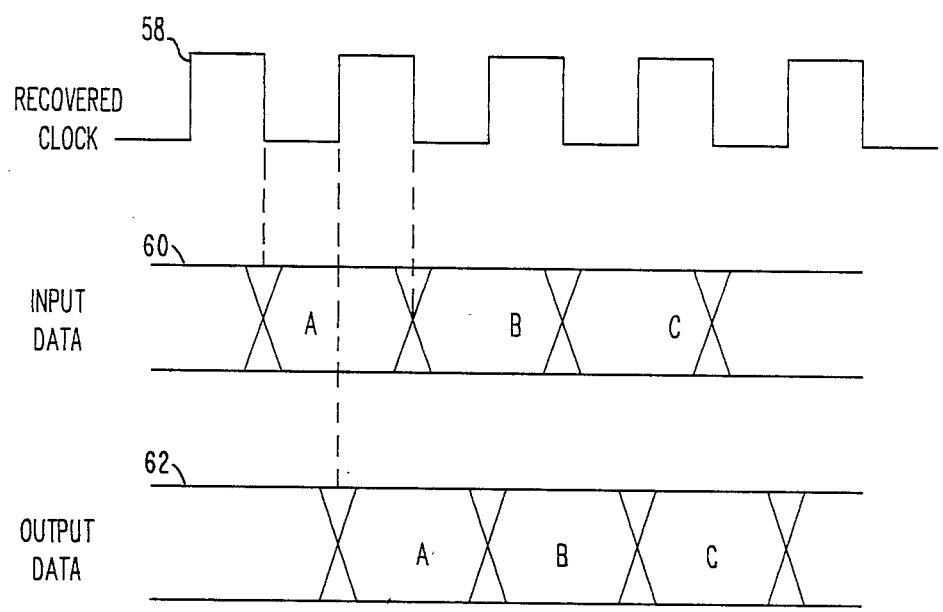
FIG. 5

CLOCK RECOVERY SYSTEM FOR DIGITAL DATA

BACKGROUND OF THE INVENTION

The present invention relates to digital communications systems and particularly to the receiver portion where digital data signals are received and decoded. The system derives a clock signal or recovers a clock signal from the digital data signal itself which does not have a clock signal transmitted separately with the digital data signal.

A data rate clock is needed in almost any digital data transmission system that receives, decodes, or performs any operation on the data. It is often impractical or inefficient to transmit a separate clock signal along with the data. For these situations the data clock can be derived from the data signal itself. Some data transmission schemes (such as Manchester coding) utilize pulse shapes from which the clocks can be easily recovered. Unfortunately, these schemes require excessive bandwidth and are difficult to implement at higher data rates where the components or channel are bandlimited. Therefore bandwidth efficient data transmission techniques such as non-return-to-zero are frequently employed and the data rate clock must be recovered from the non-return-to-zero (NRZ) signal.

A phase locked loop (PLL) type of circuit is used to recover the clock from an NRZ data signal. An ordinary PLL cannot be used to recover the data clock because the NRZ data signal does not contain a discrete spectral component at the data rate. In fact, a spectral null appears at the data rate frequency. Conventional clock recovery circuits employ various filters (differentiators), squaring devices, multiplying devices and samplers along with a voltage controlled oscillator (VCO) which ultimately generates the clock. The filtering and nonlinear devices contribute to the imprecision of the output phase estimate (phase error) and may require adjustment for proper alignment of the clock within the data.

The clock recovery technique of the present invention employs a unique method of aligning the clock to the data signal and performing the sampling and filtering operations such that filter adjustment for phase alignment is not needed and the clock recovery circuit can be implemented with commercially available components up to several hundred MHz.

SUMMARY OF THE INVENTION

The present invention is a system and method for recovering a clock signal from digital data signals, with the recovered clock signal being derived from the digital data signal which does not include a separate clock signal.

The system comprises means for receiving the digital data signal, means for detecting transitions from one logic state to the other logic state in the digital data signal. Also included are means for comparing the time alignment of an input clock signal, had from a voltage controlled crystal oscillator means, to the logic transition, and means for generating a correction control signal as a function of the time alignment of the digital data signal transition with the input clock signal. The voltage controlled crystal oscillator means provides the input clock signal for the means for detecting logic transitions. The correction control signal is input to the oscillator means to vary the frequency of the clock signal as a function of this correction control signal, whereby a digital data recovered clock signal is aligned with the digital data signal.

The system and method of the present invention eliminates the need for phase adjustment or compensation, and works at very high speeds due to the simplicity and non-critical gate delays.

In the embodiment of FIG. 1, phase corrections are made only on the rising edge of data transitions. The PLL attempts to align the rising edges of both input data signal and the output signal of the voltage controlled crystal oscillator (VCXO).

BRIEF DESCRIPTIONS OF THE DRAWINGS

FIG. 4A illustrates typical waveforms for the digital data signal and the clock signal from the voltage controlled crystal oscillator to illustrate the situation where the clock pulse leads the data transition.

FIG. 4B illustrates typical waveforms for the digital data signal and the clock signal from the VCXO to illustrate the situation where the clock pulse lags the data transition.

FIG. 5A illustrates a recovery clock signal waveform.

FIG. 5B illustrates an input data pattern of bits A, B, C with transitions between bits illustrated by the X between bits, with these transitions aligned with the trailing edge of the recovered clock waveform.

FIG. 5C illustrates an output data pattern of bits A, B, C with transitions between the bits illustrated by the X between bits, with these transitions aligned with the leading edge of the recovered clock waveform.

DESCRIPTION OF THE PREFERRED EMBODIMENT

Figure 1:
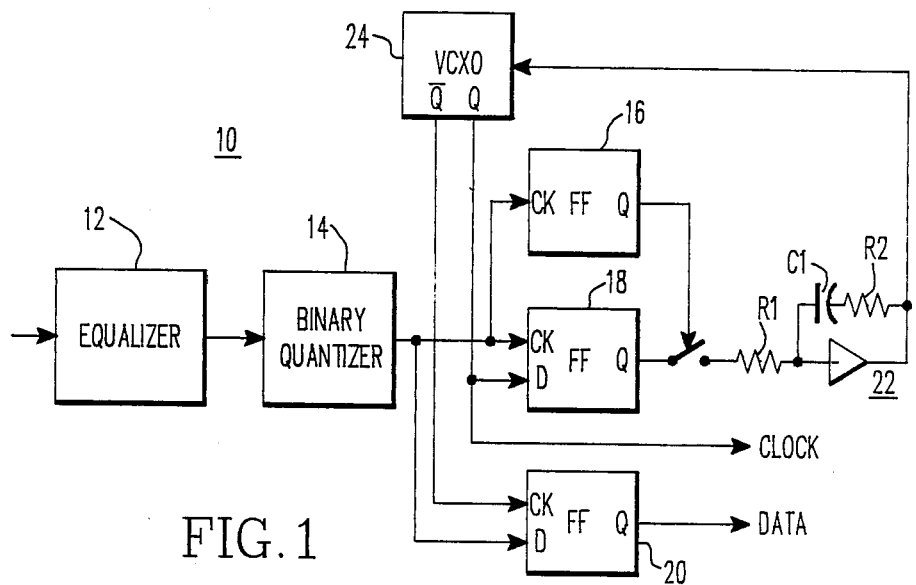
FIG. 1 is a functional schematic of the digital data clock recovery system of the present invention.

The present invention can be best understood by reference to the exemplary embodiments. The high speed data signal clock recovery system 10 is seen in FIG. 1 in a functional schematic. The system 10 may include data signal conditioning means such as an equalizer 12 serially connected to a binary quantizer 14. The conditioned digital data signal may be a long random digital data stream which does not include a clock signal, or for more detailed embodiments discussed later may be transition coded digital data. This digital data input is illustrated in FIGS. 4A, 4B, and 5B.

The digital data signal is input in parallel to a one shot flip-flop 16, and to D type flip-flops 18 and 20. The output of flip-flop 16 is seen as connected to the output of flip-flop 18, and functionally connectable to integrator means 22, which has its output connected to voltage controlled crystal oscillator means 24. This oscillator means 24 has complementary output clock signal outputs Q and $\overline{Q}$, with the Q output functioning as a clock signal input to flip-flop 18 to complete a phase loop locked network for varying the frequency of the clock signal output from the oscillator means 24. The $\overline{Q}$ clock signal output is input to flip-flop 20 along with the digital data signal and the data output signal from flip-flop 20 is aligned in time with the trailing (falling) edge of the recovered clock signal had as an output of the oscillator means 24 after it has been corrected.

In operation, the system 10 functions such that if the rising edge of the input digital data precedes the rising edge of the oscillator means 24 Q output, then the loop filter integrates in a positive direction for a time predetermined by the one shot flip-flop 16. The positive correction increases the frequency of the oscillator means 24 and advances the VCXO phase by an amount proportioned to the one shot time and the integration rate. If the rising edge of the input follows the rising edge of the VCXO Q output, then a negative correction retards the VCXO phase. The shortest time between phase corrections is the shortest time between two rising edges of data or two bits times. If the integration time is fixed by the one shot, then the phase change for each correction is determined by the RC product of the integrator, the amplitude of the phase correction pulse input to the integrator, and the voltage to frequency conversion factor of the VCXO. A switch 51 is seen connected between the output of flip-flop 18, with a switching control provided by flip-flop 16, and the integrator 22, with an input resistor R1 serially connected to the input of the integrator, and with C1 and R2 in a parallel path.

Figure 2:
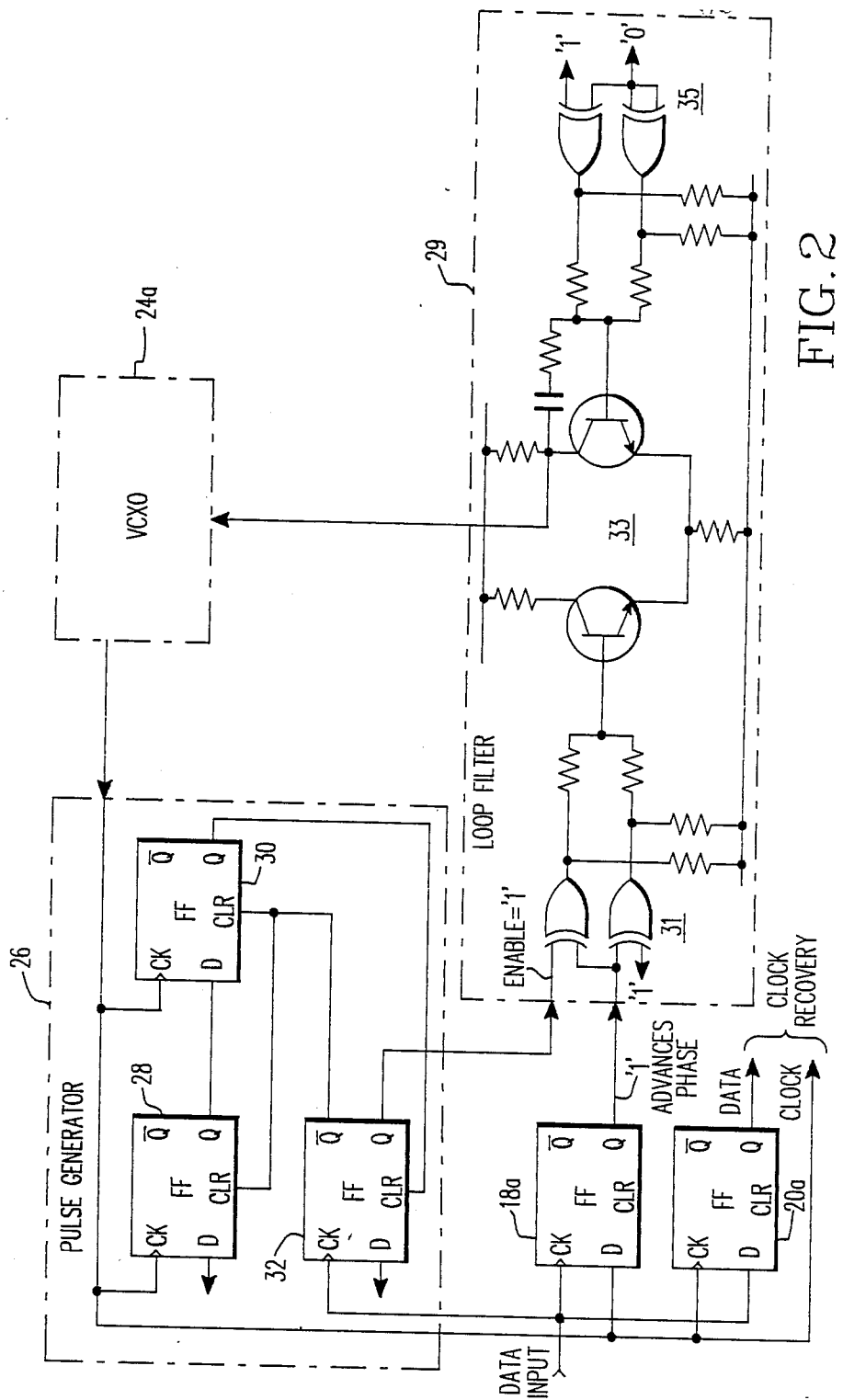
FIG. 2 is a more detailed schematic block diagram for implementing the functions of the FIG. 1 embodiment.

The actual implemented circuit for implementing the functional FIG. 1 embodiment can be found in FIG. 2. In the FIG. 2 detailed circuit, the pulse generator block 26 performs the function of the one shot flip-flop 16 of FIG. 1, while the loop filter block 29 performs the switch function and integrator function. The exclusive OR network 31 at the left of loop filter block 29 performs the switch and the transistor network 33 performs the integrator function, with the exclusive OR network 35 at the right providing a fixed voltage state for comparison. One unique feature is the phase detector circuit consisting primarily of flip flop 18a. As can be seen, if a logic "1" is clocked into 18a, then the data input phase must be ahead of the VCXO clock phase and this "1" advances the VCXO clock phase. Alternately a logic "0" retards the VCXO clock phase. Note from FIGS. 5A-5C that aligning the positive edge of the data signal with the negative edge of the clock ensures that the positive edge of the clock coincides with the center of the bit pulse which is desired to maximize the signal-to-noise at the sampling point which has the largest "eye opening". Also note that this is automatically aligned without filter adjustment. This is due to the fact that in other methods a harmonic at the clock rate is derived from the data signal by squaring and filtering in an analog circuit which can result in a phase error which can be minimized by proper adjustment. The "digital phase detector" described in this invention eliminates the need for this kind of adjustment. The pulse generator 26 is made up of flip-flops 28, 30 and 32, with 28 and 30 connected in parallel to receive the clock signal which is the output of the oscillator means 24a. The flip-flop 32 is input with the digital data signal, and flip-flop 32 output $\overline{Q}$ is input to the flip-flops 28, 30, while output Q from flip-flop 32 is input to the exclusive OR network 31. The flip-flop 28 output Q signal is input to flip-flop 30 at the D input, and the flip-flop 30 Q output is connected to flip-flop 32 at the CLR input.

Figure 3:
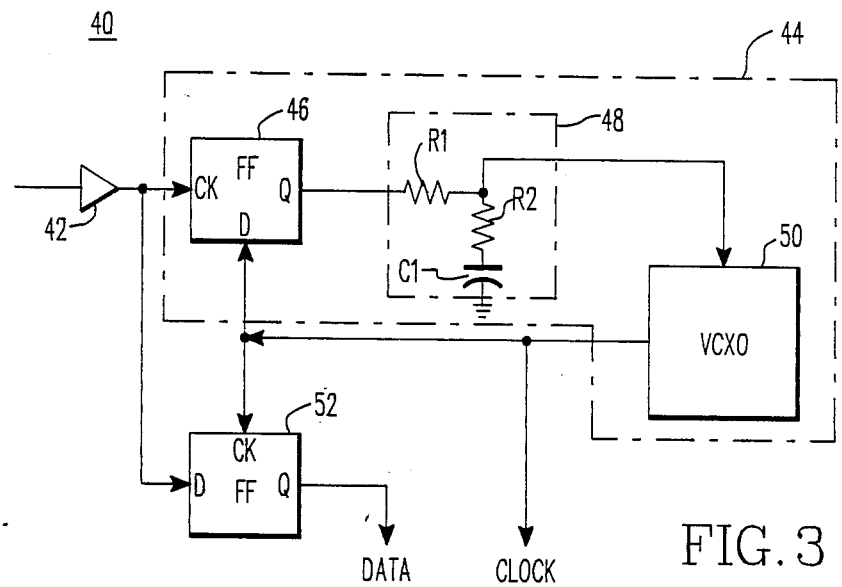
FIG. 3 is another embodiment in block diagram form of a simplified data clock recovery system.
Figure 6:
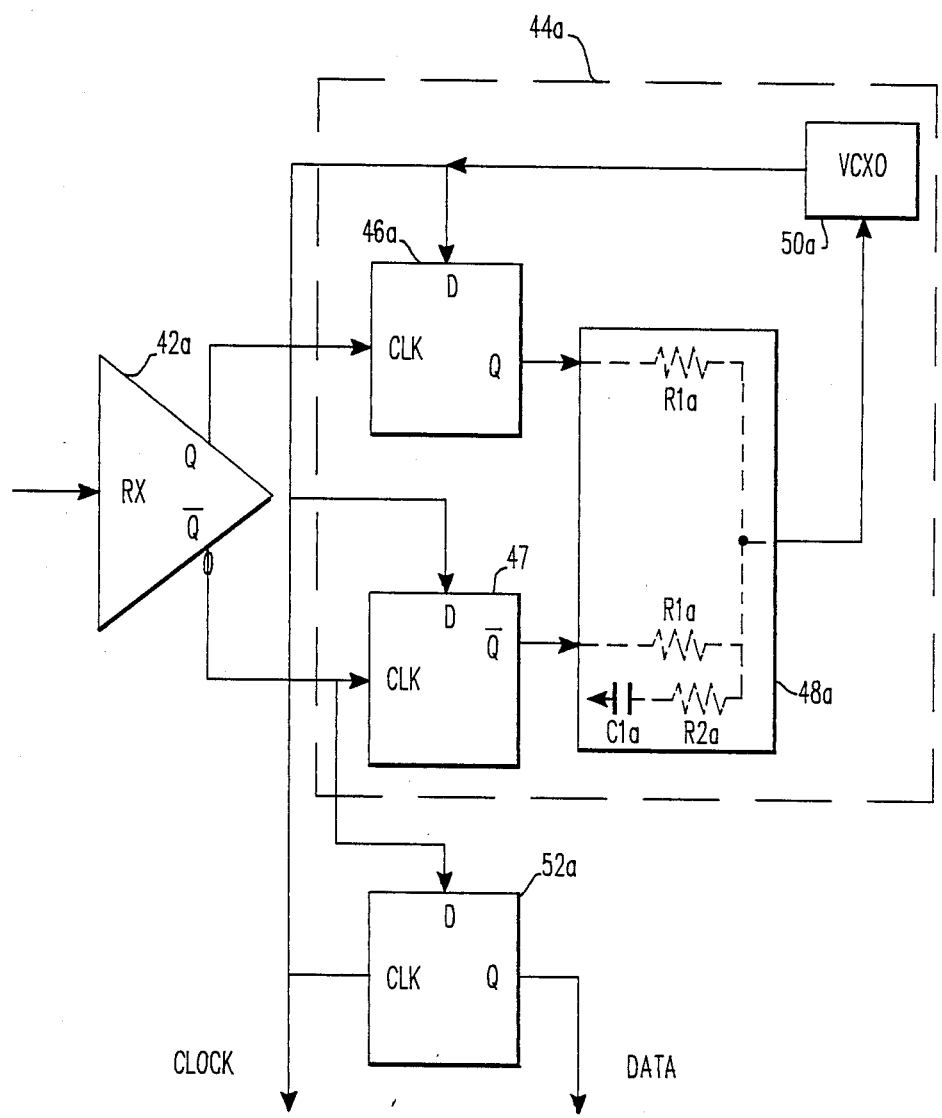
FIG. 6 is yet another embodiment clock recovery system which is operable with both rising and falling data signal transitions to correct the phase error.

The alternate embodiments of the present invention seen in FIGS. 3 and 6 represent a simplified clock recovery system which is usable with transition coded digital data. The coding is such as to limit the maximum time between data transitions so as to make it easier to maintain the accuracy of the derived, i.e., recovered clock signal with a simplified system.

One example of a special coding technique to aid in clock recovery is called 4B/5B coding. The coding scheme encodes 4-bit groups of information bits into 5-bit groupings which guarantees at least one positive and one negative data transition for each 5-bit grouping.

Two other possible special coding techniques include Manchester coding and ASCII with odd parity which limit the maximum time between logic transitions, and these coded signals can be used with these embodiments.

A new and simplified clock recovery system is seen in FIG. 3, which is designed for transition coded data signals such as 4B/5B coded digital signals.

In FIG. 3, the clock recovery system 40 comprises the digital data receiver 42, which receives and inputs the transition coded digital data to the phase locked loop 44. The phased locked loop 44 comprises D-type flip-flop 46 which is serially connected to a loop filter means 48, which is in turn serially connected to voltage controlled crystal oscillator means 50. The loop filter means functions to control the time response based on the resistance and capacitance values for R3, R4 and C2. This loop filter can be dispersed with for first order corrections, and is primarily intended for higher order phase locked loops.

A D-type flip-flop 52 is seen paralleled with the phased locked loop 44, so that the transition coded data is input to this flip-flop 52.

The operation of the clock recovery system of FIG. 3 can be understood by reference to the waveforms seen in FIGS. 4A and 4B, where the VCXO clock waveforms 54a and 54b are seen above the transition coded digital data signal 56a and 56b for the situations where the clock leads the data in FIG. 4A, and where the clock lags the data in FIG. 4B. The recovered clock waveform 58 is seen in FIG. 5A, while the transition coded digital data signal 60 is seen as it is input to the system in FIG. 5B, and as it is output 62 aligned with the recovered clock in FIG. 5C. The digital data bits are labeled A, B, C, while the transitions between bits is shown as an "X".

The operation of the clock recovery technique is very simple and highly accurate due to the VCXO. The PLL consists of a phase detector, a loop filter and a VCXO. The phase detector is a D-type flip-flop which is clocked only on a rising edge data transition. The signal being clocked into this flip-flop is actually the VCXO clock output. If the input data transition clocks in a logic one from the clock, then the VCXO clock edge lags the data as seen in FIG. 4B. Conversely, if the input data transition clocks in a logic zero from the clock, then the VCXO clock edge leads the data as shown in FIG. 4A.

If the rising edge of the input precedes the rising edge of the VCXO clock output, then the loop filter swings in a positive direction. The positive correction increases the frequency of the VCXO and advances the VCXO phase. If the rising edge of the input follows the rising edge of the VCXO output, then a negative correction retards the VCXO phase. The shortest time between phase corrections is the shortest time between two rising edges of data or two bits times.

Simplification over the system of FIG. 1 and 2 is possible due to the fact that the maximum time between rising data edges is no longer than 5 bits. This allows removal of the enable input to the loop filter correction and the associated circuitry to generate the enable signal. This also results in simplification of the loop filter and the two state signal which drives the loop filter. The system of FIG. 1 and 2 required the enable signal and the tri-state (1,0,DISABLE) loop filter because it was necessary to stop the loop from continuing to correct when no data transitions are present. Since in the embodiment of FIG. 3 the transitions are guaranteed to be present at greater than a minimum rate due to coding, then the filter input is always enabled and the loop is always correcting the phase.

It is important to note that this clock recovery technique works for a narrow range of clock frequencies compatible with a crystal controlled oscillator. This is because this phase locked loop does not act as a frequency locked loop. This feature is actually desirable for applications requiring the accuracy of a crystal clock. Loop stability can be ensured by making the worst case loop bandwidth larger than the worst case frequency offset in combination with limiting the range of the VCXO. Since a large range of loop parameters and loop filters can be used, specific loop stability factors will not be addressed here. However, it should be obvious that a first order loop filter can be stable and is implemented by removing (or shortening) the capacitor in the loop filter.

Note that the recovered clock is used to clock the D-type flip-flop with the data input and is clocked during the middle of the data bit as shown in FIGS. 5A-5C.

In yet another embodiment of the invention seen in FIG. 6, the clock recovery system is designed to use both the rising and falling data transitions to correct the phase error. The system of FIG. 6 merely added an additional D-type flip-flop 47 to the FIG. 3 embodiment, with the other elements of FIG. 6 labelled with corresponding numbers and the suffix "a" to compare to the FIG. 3 embodiment.

With the addition of flip-flop 47, which is paralleled with flip-flop 46a as part of the phased locked loop 44a, and with a complementary transition coded digital data signal input to flip-flop 47, the clock recovery system can now use both the rising and falling data transitions to correct the phase error. Note that in the case where the positive data transition detects a clock lead (lag) condition and the negative data transition detects a clock lag (lead) condition, then the correction signal is midway between the two extremes which indicates that the loop is accurately phased locked. Therefore, the correction signal is tristate (lead, lag, remain same) which is a desirable result.

We claim:

1. A high speed data clock recovery system for digital data signals which do not include an aligned clock signal, and wherein a digital data clock signal is derived from the digital data signal, which system comprises:
    (a) means for receiving a digital data signal;
    (b) means for detecting a transition from one logic state to the other logic state in the received digital data signal, and for comparing the time alignment of an input clock signal to the logic transition and for generating a control voltage signal as a function of the time alignment of the digital data signal transition is with the input clock signal; and
    (c) voltage controlled oscillator means which provides the clock signal which is input to the means for detecting signal logic transitions and for comparing the time alignment thereof to the clock signal, with the control voltage signal being input to the voltage controlled oscillator means to vary the frequency of the clock signal as a function of the control voltage signal, whereby a digital data recovered clock signal is aligned with digital data signal.

2. The data clock recovery system set forth in claim 1, wherein the means for detecting transitions in the digital data signal includes a D-type flip-flop to which the digital data signal is input and a paralleled pulse generation network which controls generation of the control voltage signal as a function of frequency of transitions and limits application of such generated control voltage signal in the absence of a transition.

3. The data clock recovery system set forth in claim 1, wherein the digital data signal is a transition coded signal having a high frequency of transitions, and the means for detecting transitions, comparing the time alignment and generating the correction control voltage signal for the voltage controlled oscillator is a D-type flip-flop.

4. The data clock recovery system set forth in claim 3, wherein a loop filter means is serially connected between the flip-flop and the voltage controlled oscillator means to filter higher order harmonics from the correction control voltage signal.

5. The data clock recovery system set forth in claim 3, wherein a second D-type flip-flop is paralleled with the other D-type flip-flop for receiving complementary transition coded signals.

6. A method of recovering a high speed data clock from digital data signals which do not include an aligned clock signal, which method comprises:
    (a) receiving a digital data signal;
    (b) detecting logic state transitions in the digital data signal;
    (c) comparing the time alignment of an input clock signal to the detected logic state transition;
    (d) generating a control voltage signal as a function of the time alignment of the digital data signal; and
    (e) applying the generated control voltage signal to a voltage controlled oscillator means to vary the frequency of a clock signal output from the voltage controlled oscillator means to provide a digital data recovered clock signal which is aligned with the digital data signal.

7. The method set forth in claim 6, wherein the generated control voltage signal can be a positive correction signal or a negative correction signal based on logic state transitions, or a null signal based on no logic state transition.

8. The method set forth in claim 6, wherein the generated control voltage signal can be a positive correction signal or negative correction signal based on whether the logic state transition leads or lags the input clock signal, or a null correction signal which indicates that the digital data recovered clock signal is aligned with the digital data signal and no correction signal is required.

* * * * *